United States Patent [19]
Nagai

[11] Patent Number: 5,923,091
[45] Date of Patent: *Jul. 13, 1999

[54] BONDED SEMICONDUCTOR INTEGRATED CIRCUIT DEVICE

[75] Inventor: Takao Nagai, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/917,342

[22] Filed: Aug. 26, 1997

[30] Foreign Application Priority Data

Feb. 21, 1997 [JP] Japan .................................. 9-037408

[51] Int. Cl.$^6$ .................................................. H01L 23/538
[52] U.S. Cl. .......................................... 257/777; 257/786
[58] Field of Search .................................... 257/777, 778, 257/723, 724, 786, 785, 780

[56] References Cited

U.S. PATENT DOCUMENTS 4,797,723   1/1989   Nishimura et al. .

FOREIGN PATENT DOCUMENTS

| 58-90769 | 5/1983 | Japan . |
| 61-112338 | 5/1986 | Japan . |
| 62-4353 | 1/1987 | Japan . |
| 64-28856 | 1/1989 | Japan . |

*Primary Examiner*—David B. Hardy
*Attorney, Agent, or Firm*—McDermott, Will & Emery

[57] ABSTRACT

Cells and wiring patterns constituting a single integrated circuit device are divided into two or more parts to be formed on two or more semiconductor chips, respectively. The semiconductor chips are bonded face-to-face to each other so that the I/O pins of the cells are connected to each other. Thus, the length of the wiring pattern connecting the cells to each other can be shortened.

6 Claims, 8 Drawing Sheets

⇩ DIVIDING

↶ BONDING

⇩ DIVIDING

⤺ BONDING

BONDING

LAYOUT DIAGRAM     CELL DIAGRAM

ISLAND (P-WELL)

— · — · — ISLAND BOUNDARY

— — — — ISOLATION BOUNDARY

▨▨▨ $P^+$ DIFFUSION

▨▨▨ $n^+$ DIFFUSION

☐ METAL

▦▦▦ POLYSILICON

⇩ DIVIDING

↶ BONDING

BONDED SEMICONDUCTOR INTEGRATED CIRCUIT DEVICE

BACKGROUND OF THE INVENTION

The present invention relates to a structure of an integrated circuit device.

FIG. 8 is a schematic plan view showing a conventional general semiconductor integrated circuit. As seen from FIG. 8, a group of cells 2A, . . . 2B each having a prescribed circuit function are arranged on the main surface of a single semiconductor chip 1A, and wiring is made between predetermined cells of the group to constitute an entire circuit. Bonding pads 5 arranged on the semiconductor chip 1A serve to connect electrodes within the chip to external wirings.

Because of the above structure of the conventional semiconductor integrated circuit device, as in the case where an I/O pin 3a of the cell 2A is connected to an I/O pin 3b of the cell 2B on the semiconductor chip 1A, the distance between the cells is disadvantageously lengthened with an increase in the number of cells in the group and advancement scale of the integration. This leads to an increase in the chip area and delay of signals. In the future, these problems will become more remarkable with an increase in the integration scale.

SUMMARY OF THE INVENTION

The present invention has been accomplished to solve these problems.

An object of the present invention is to provide a semiconductor circuit device which can shorten the length of wiring patterns connecting the cells to each other by dividing the group of cells and of wiring patterns into plural parts to be bonded to one another.

The techniques of bonding a plurality of chips to face to each other to constitute a single integral chip are disclosed in e.g. JP-A-61-112338, JP-A-62-4353 and JP-A-64-28856. These techniques, however, intend to connect I/O bonding pads for chips each having an individual circuit having a prescribed function using wires or protruding electrode and metallic frame, but do not have a function of shortening the internal wiring. On the other hand, the present invention intends to divide the group of cells and wiring patterns formed on the semiconductor chip into plural parts which are bonded to face to each other, thereby shortening the length itself of the internal wiring connecting the cells to each other.

In order to attain the above object, in accordance with the present invention, there is provided a semiconductor integrated circuit wherein a group of cells and a group of wiring patterns constituting a single integrated circuit pattern are divided into a plurality of parts and formed on respective semiconductor chips; and the plurality of semiconductor chips bonded face to face to each other to constitute a prescribed circuit.

According to the invention, I/O pins of the cells are connected to each other so that the largest number of pins overlap with each other. The I/O pins not overlapping are connected through wiring patterns.

The group of cells and wiring patterns may be divided into three or more parts. Such a manner of dividing the pattern on the single chip into three or more parts may increase the number of cells with pins which can be connected to each other.

Preferably, the group of cells is divided into a plurality of sub-groups of cells and formed on respective semiconductor chips.

Preferably, the cells and the wiring patterns are divided into a group of cells and a group of wiring patterns, each group being formed on a respective semiconductor chip.

Preferably, the cells and the wiring patterns are divided into a group of cells and a group of patterns of a power source and a GND, which are formed on respective semiconductor chips.

The divided plurality of patterns may be fabricated by different process technologies.

In accordance with a present invention, the wiring path for connecting the I/O pins of the cells face to face with each other is not required. The length of the wiring path of I/O pins of the cells which cannot be arranged face to face can also be shortened. The signal delay due to an increase in the wiring pattern can be reduced. Further, because of reduction in the area required for the wiring pattern, the sum of the area of the two divisional patterns can be made smaller.

DESCRIPTION OF THE PREFERRED EMBODIMENTS

Embodiment 1

FIGS. 1A to 1D are views showing the semiconductor integrated circuit according to the first embodiment. In connection with the first embodiment, an explanation will be given of the basic concept of the present invention, i.e., the technique of dividing a plurality of cells each having a predetermined circuit function into groups to shorten the wiring length between the cells.

Figure 1A:
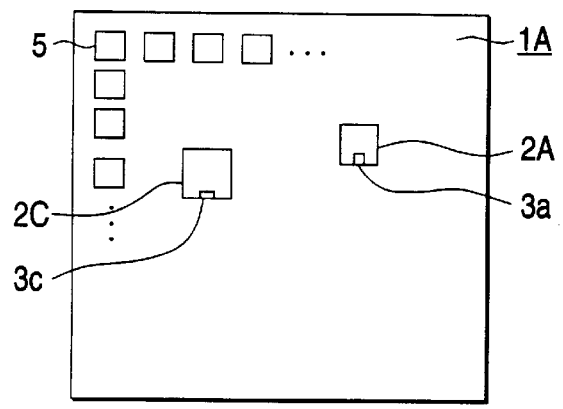
FIGS. 1A to 1D are views showing the structure of an integrated circuit device according to the first embodiment of the present invention.
Figure 1B:
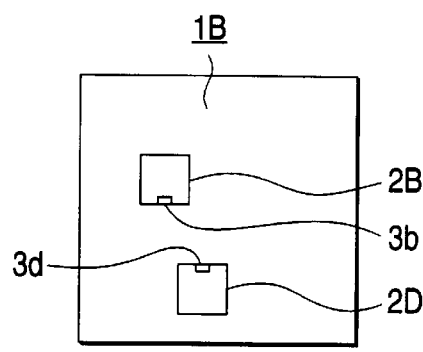
Figure 8:
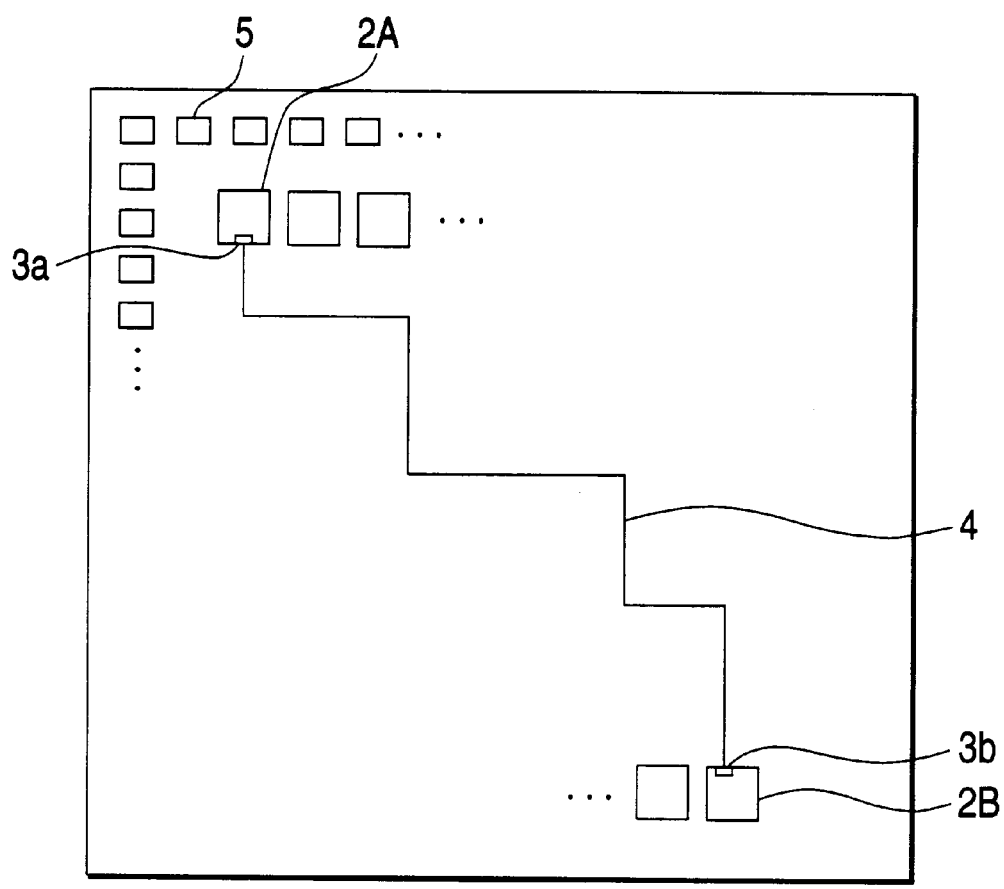
FIG. 8 is a schematic plan view of a conventional semiconductor circuit device.

FIGS. 1A and 1B are schematic plan views showing a semiconductor chip having pattern 1A of a first group of cells, and another semiconductor chip having pattern 1B of a second group of cells. Now, cells of a prescribed integrated circuit which are mounted on a semiconductor chip conventionally, e.g. a plurality of cells 2A, . . . , 2B shown in FIG. 8 are divided into pattern 1A of a first group of cells 2A, 2C, . . . and pattern 1B of a second group of cells 2B, 2D, . . . . Thus, two semiconductor chips on which the patterns 1A and 1B are mounted are prepared. Further, I/O pin 3*a* of the cell 2A and I/O pin 3*b* of the cell 2B are connected to each other while I/O pin 3*c* of the cell 2C and I/O pin 3*b* of the cell 2C are connected to each other. Bonding pads 5 are provided on the pattern 1A and externally wired by wire bonding.

Figure 1C:
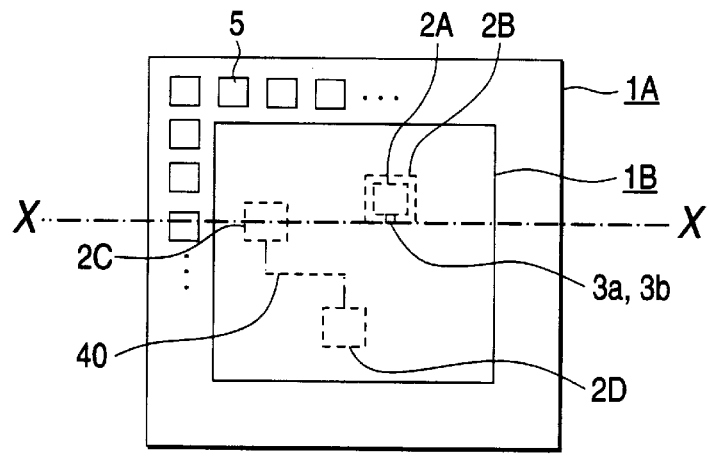

FIG. 1C is a plan view of the state where the semiconductor chips having the patterns 1A and 1B, respectively are bonded face to face with each other. The second pattern 1B is arranged in such a fashion that its front surface is directed to the plane of the paper. The semiconductor chips having the patterns 1A and 1B are fabricated individually, and their patterns are bonded face-to-face with each other. In this case, I/O pins 3*a* and 3*b* of the cells 2A and 2B are directly bonded to each other. The I/O pins 3*c* and 3*d* of the cells 2C and 2D are connected to each other by a wiring pattern 40. Thus, a predetermined circuit function can be realized.

Figure 1D:
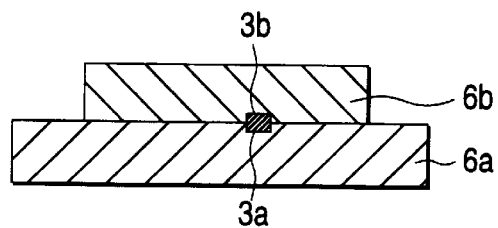

In the pattern shown in FIG. 1C, the cell arrangement is determined so that the I/O pins to which the largest number of cells overlap with each other. Only the cells which do not overlap are connected to each other by a wiring. FIG. 1D is a sectional view taken along line X—X of FIG. 1C, which shows the I/O pins 3*a* and 3*b* connected to each other at the same point.

The areas other than those of the I/O pins are insulated by an oxide film. Because of the fabrication steps in an integrated circuit such as multi-layer wiring, the surfaces of the two semiconductor chips to bonded may not be necessarily be planar as long as the pins can be connected. In order to make good contact between the pins to be bonded face to face with each other, the pins may be made of metal having a low melting point.

In accordance with the first embodiment of the present invention, the wiring paths for connecting the I/O pins of the cells face-to-face with each other are not required. The lengths of the wiring paths between I/O pins of the cells which cannot be arranged face-to-face can also be shortened. Signal delay due to an increase in the wiring pattern thus can be reduced. Further, because of the reduction in the area required for the wiring pattern, the sum of the area of the two divisional patterns 1A and 1B can be made smaller.

Embodiment 2

Figure 2A:
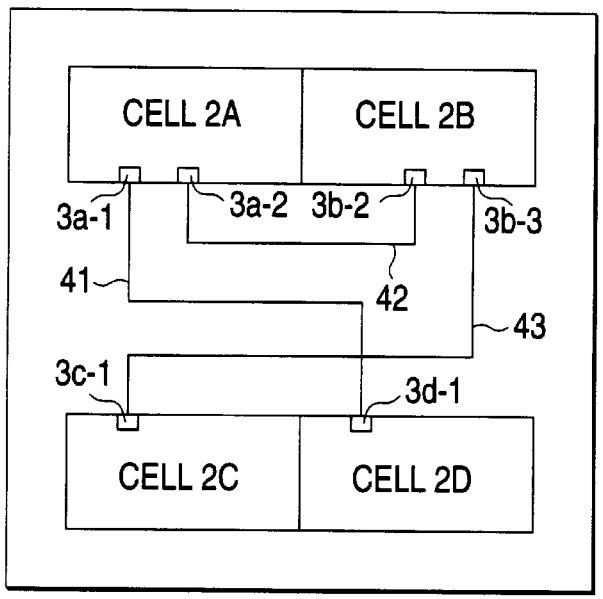
FIGS. 2A to 2C are plan views showing the structure of an integrated circuit device according to the second embodiment of the present invention.
Figure 2B:
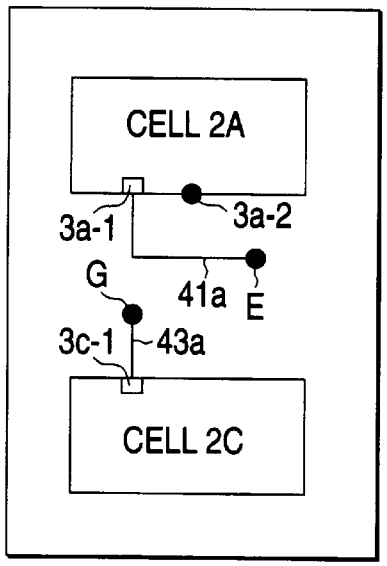
Figure 2C:
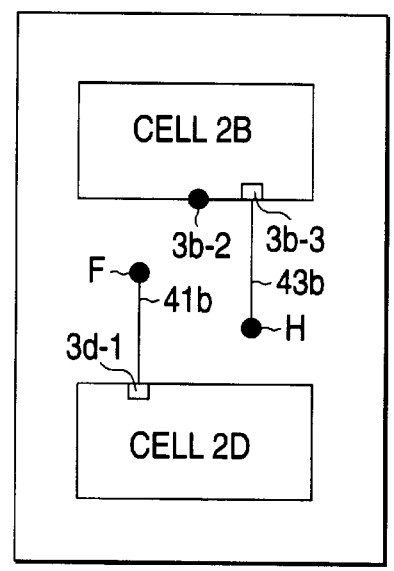

FIGS. 2A to 2C are plan views showing the structure of a semiconductor integrated circuit according to the second embodiment. This embodiment is directed to another example of dividing a plurality of cells into groups to shorten the wiring distance between the cells.

FIG. 2A is a plan view of the pattern in which cells 2A to 2D each having a predetermined circuit function are arranged on a single chip. An I/O pin 3*a*-1 of cell 2A and an I/O pin 3*d*-1 of cell 2D are connected to each other by a wiring pattern 41. An I/O pin 3*a*-2 of the cell 2A and an I/O pin 3*b*-2 of cell 2B are connected to each other by a wiring pattern 42. An I/O pin 3*b*-3 of the cell 2B and the I/O pin 3*c*-1 of the cell 2C are connected to each other by a wiring pattern 43.

In this embodiment, the cells on the semiconductor chip of FIG. 2A are divided into a first semiconductor chip having cells 2A and 2C shown in FIG. 2B and a second semiconductor chip having cells 2B and 2D shown in FIG. 2C. The first and second semiconductor chips are bonded face-to-face with each other. In this case, the I/O pin 3*a*-2 of the cell 2A and the I/O pin 3*b*-2 of the cell 2B are connected to each other at the same point. The I/O pin 3*a*-1 of the cell 2A and the I/O pin 3*d*-1 of the cell 2D are connected through wiring patterns 41*a* and 41*b* and connecting points E and F, whereas the I/O pin 3*b*-3 of the cell 2B and the I/O pin 3*c*-1 of the cell 2C are connected through wiring patterns 43*a* and 43*b* and connecting points G and H.

Thus, in accordance with the second embodiment, the wiring pattern 42 for connection between the I/O pin 3*a*-2 and 3*b*-2 of the cells 2A and 2B arranged face-to-face is not required. Also, the lengths of the wiring paths for connection between the I/O pin 3*b*-3 of the cell 2B and the I/O pin 3*c*-1 of the cell 2C and between the I/O 3*a*-1 of the cell 2A and the I/O pin of the cell 2D can be shortened. Therefore, the signal delay due to an increase in the wiring length can be reduced. Further, since the area necessary for the wiring pattern is reduced, the sum of the areas on the divided semiconductor chips becomes smaller than that of the pattern on the single semiconductor chip shown in FIG. 2A.

Embodiment 3

Figure 3A:
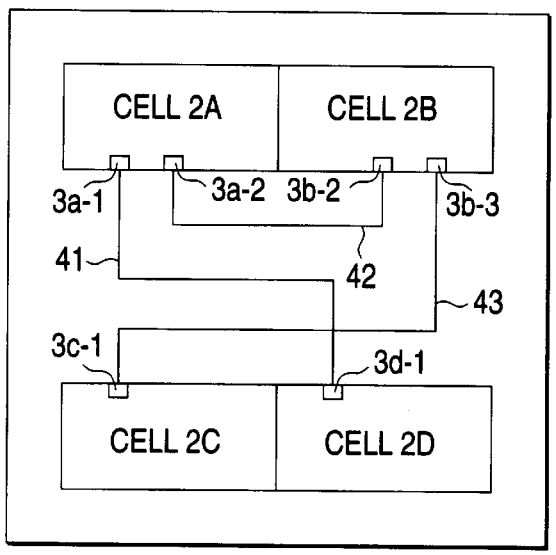
FIGS. 3A to 3C are plan views of the structure of the third embodiment of the present invention.
Figure 3B:
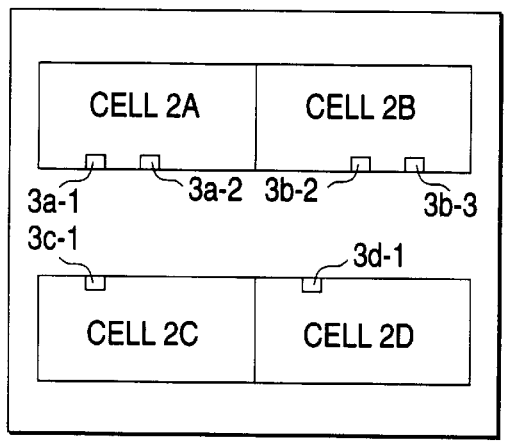
Figure 3C:
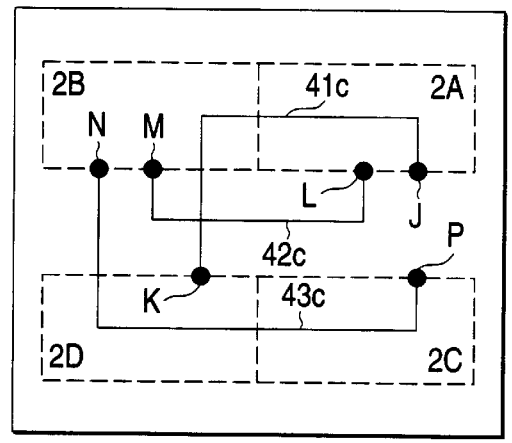

FIGS. 3A to 3C are plan views of the structure of the semiconductor integrated circuit according to the third embodiment. This embodiment is directed to an example of dividing the pattern on a semiconductor chip into a group of cells and a group of wiring patterns to shorten the wiring length.

FIG. 3A is a plan view of the pattern on which cells 2A to 2D and wiring patterns 41 to 43 are arranged on a single semiconductor chip as in the case of FIG. 2A. In this embodiment, the combination of cells and wiring patterns on the semiconductor chip as shown in FIG. 3A is divided into a first semiconductor chip having cells 2A to 2D shown in FIG. 3B and a second semiconductor chip having wiring patterns 41*c* to 43*c* shown in FIG. 3C. The first and second semiconductor chips are bonded face to face to each other. In this case, the connecting points J and K of the wiring pattern 41*c* are connected to the I/O pin 3*a*-1 of the cell 2A and the I/O pin 3*d*-1 of the cell 2D, respectively. The connecting points L and M of the wiring pattern 42*c* are also connected to the I/O pin 3*a*-2 of the cell 2A and the I/O pin 3*b*-2 of the cell 2B, respectively. Further, the connecting points N and P of the wiring pattern 43*c* are connected to the I/O pin 3*b*-3 of the cell 2B and I/O pin 3*c*-1 of the cell 2C, respectively.

In accordance with this embodiment, the two semiconductor chips respectively having the group of cells and group of wiring patterns separated from the pattern formed on the single chip are bonded face-to-face. Therefore, the cell interval between the semiconductor chip on which the group of cells is mounted is shortened. As a result, the wiring pattern connecting the cells to each other is also shortened. Therefore, the signal delay due to an increase in the wiring length can be also reduced.

Embodiment 4

This embodiment is directed to simple division of a group of cells and a group of wiring patterns on a semiconductor chip.

Figure 4A:
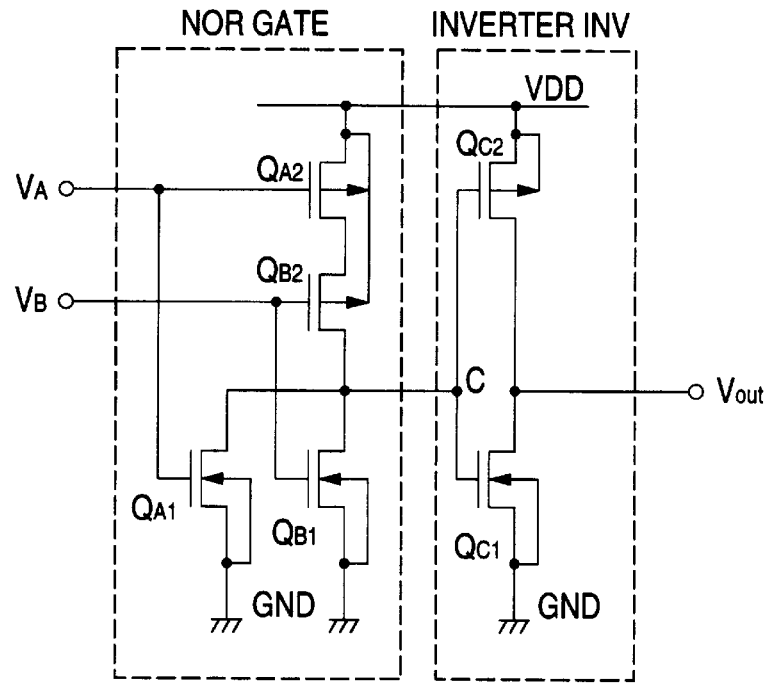
FIGS. 4A and 4B are a circuit diagram and a plan view of the integrated circuit device according to the present invention in which an OR gate is realized by an NOR gate and an inverter.
Figure 4B:
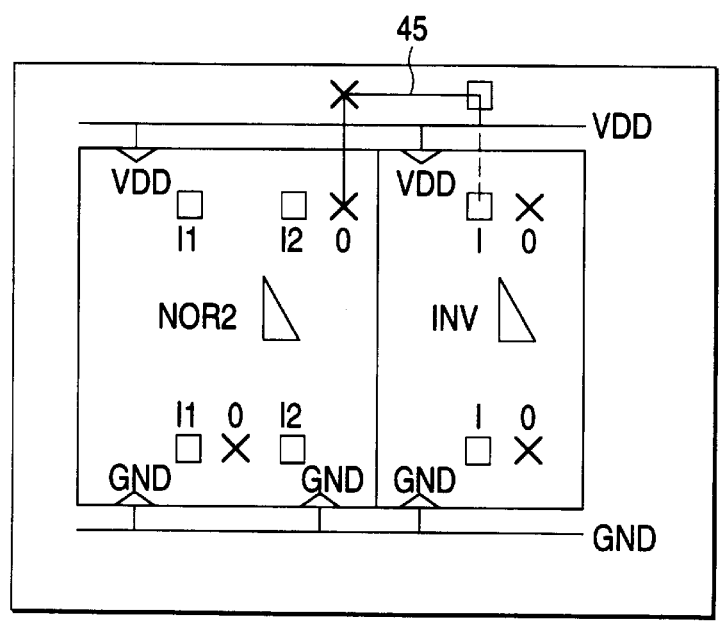

FIGS. 4A and 4B show an OR gate composed of an NOR gate and inverter (NOT gate). FIG. 4A is a circuit diagram of a CMOS transistor circuit, and FIG. 4B symbolically shows two cells on a semiconductor chip. As seen from FIG. 4A, the NOR gate is composed of transistors $Q_{A1}$-$Q_{B2}$ and the inverter is composed of $Q_{C1}$-$Q_{C2}$. In FIG. 4A, $V_A$ and $V_B$ correspond to $I_1$ and $I_2$ of NOR gate of the cell notation in FIG. 4B, whereas $V_{out}$ corresponds to O in the inverter.

Figure 5:
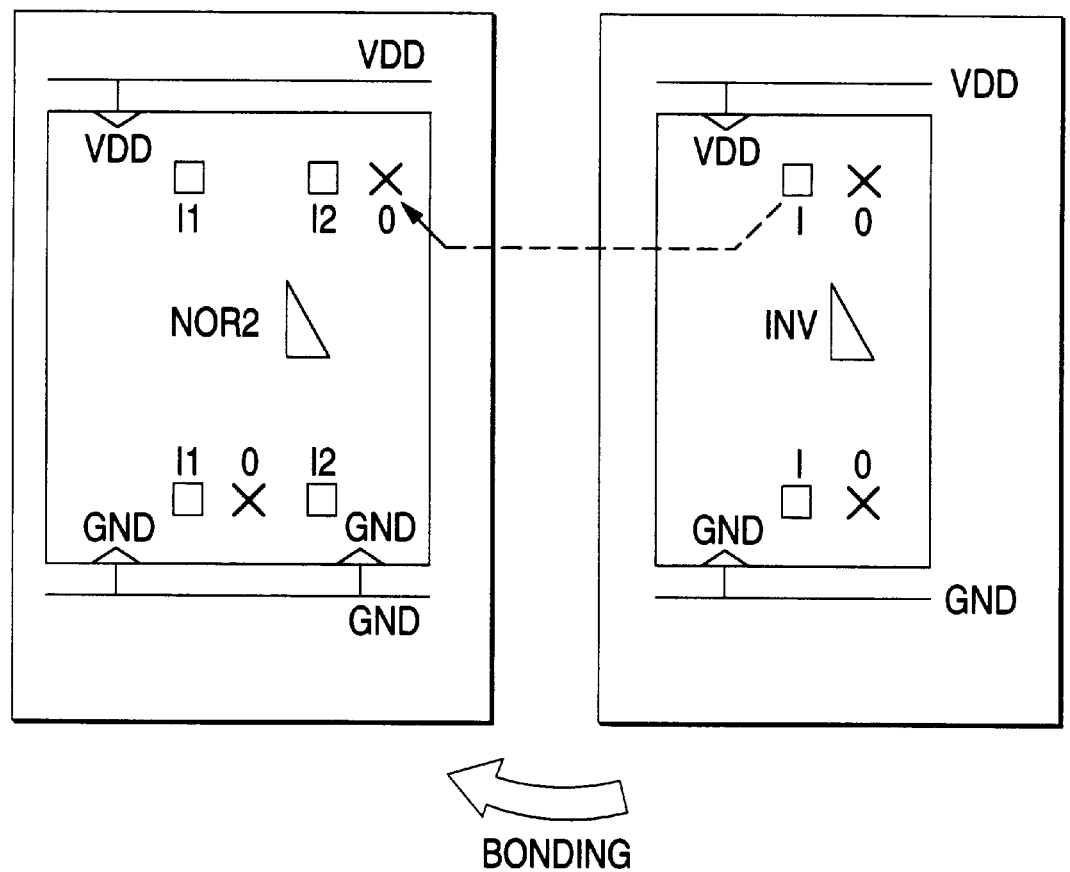
FIG. 5 is a plan view of the structure of an integrated circuit device according to the fourth embodiment of the present invention.

In this embodiment, as seen from FIG. 5, the NOR cell, inverter and wiring pattern are divided into a first semiconductor chip having a NOR cell and a second semiconductor chip having an inverter cell. The first and second semiconductor chips are bonded face-to-face to each other so that the output pin O of the NOR cell and the input pin I of the inverter cell overlap with each other, thus electrically connecting them to each other.

In accordance with this embodiment, the wiring pattern 45 connecting the output pin of the NOR gate in FIG. 4B and the input pin I of the inverter gate can be omitted, thereby shortening the wiring length therebetween. The area of the entire pattern can be also reduced by the wiring pattern 45 connecting the output pin O of the NOR gate and input pin I of the inverter gate.

Figure 6A:
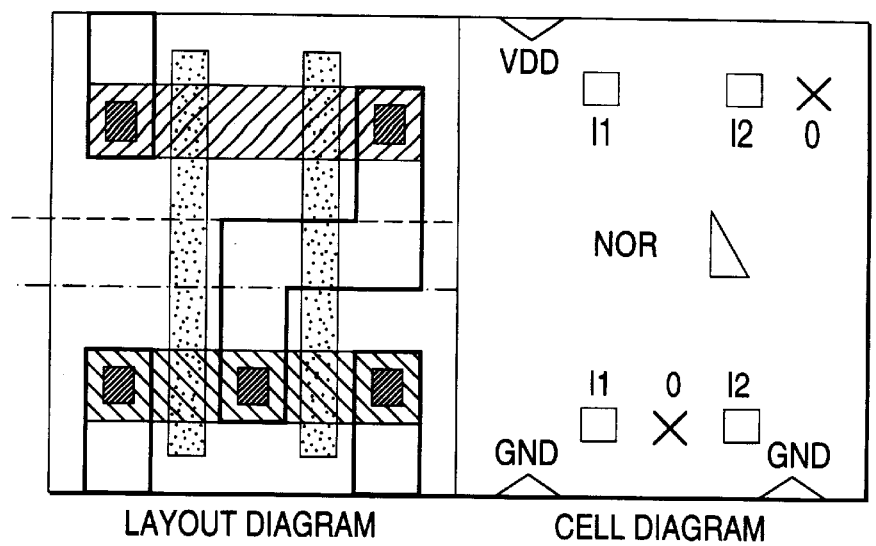
FIGS. 6A and 6B are views showing the correspondence between the representation of cells and the layout of an NOR gate and inverter gates.
Figure 6B:
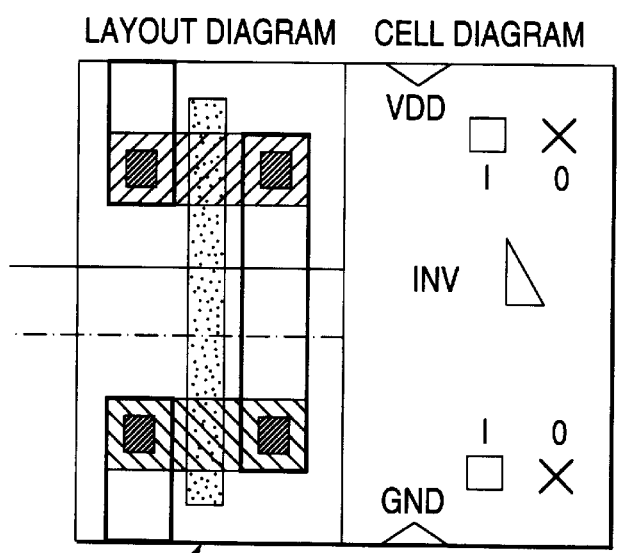

Incidentally, FIGS. 6A and 6B shows the correspondence between the layout of the NOR gate and inverter gate INV and the cell pattern.

Embodiment 5

This embodiment is directed to division of the pattern on a semiconductor chip into a group of cells and a wiring pattern of a power source and GND.

Figure 7A:
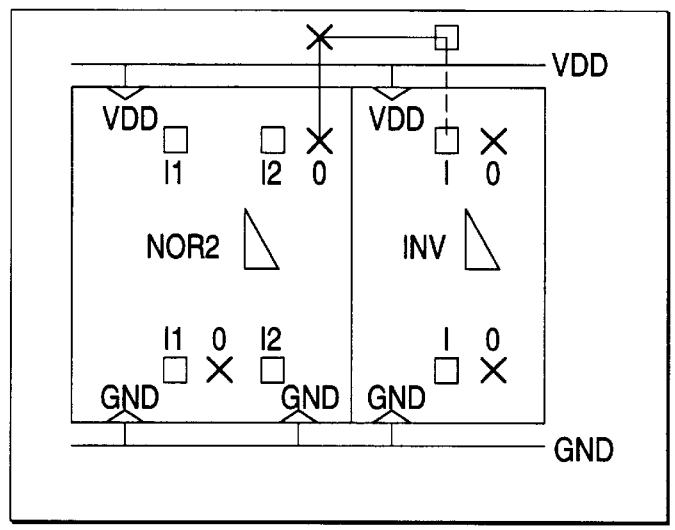
FIGS. 7A to 7C are plan views of the structure of an integrated circuit device according to the fifth embodiment of the present invention.
Figure 7B:
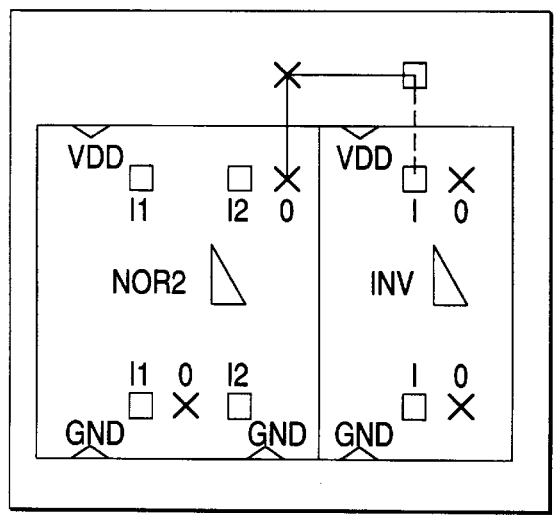
Figure 7C:
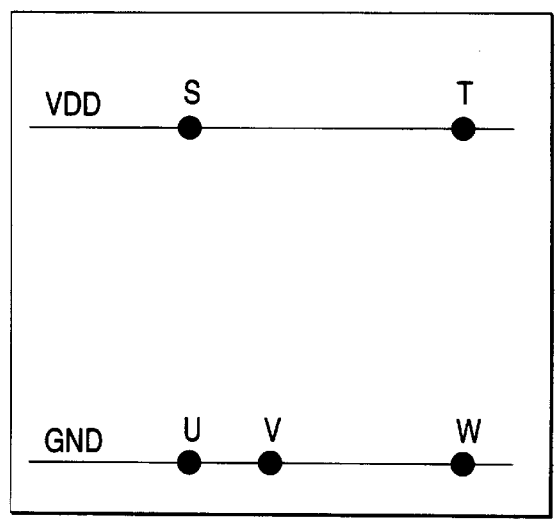

FIG. 7A shows an OR gate composed of an NOR gate and an inverter (NOT gate), which is a CMOS transistor as in FIG. 4B. In this embodiment, the OR gate realized on a single semiconductor chip is divided into a first semiconductor chip having a group of a NOR cell and inverter cell as shown in FIG. 7B and a second semiconductor chip having a pattern of a power source VDD and GND as shown in FIG. 7C. The first and second semiconductor chips are bonded face-to-face to each other so that the connecting points S and T of the wiring pattern of the power source overlap with the VDD pins of the NOR gate and invertor gate, and also the connecting points U, V and W of the wiring pattern of GND overlap with the GND pins of the NOR gate and inverter gate, thereby electrically connecting the connecting points.

In accordance with this embodiment, the two semiconductor chips having the group of cells and a wiring pattern of power source and GND, divided from the pattern on the single chip, are bonded face-to-face. Therefore, freedom in design of the wiring pattern can be improved, thereby shortening the wiring length. As a result, the signal delay due to an increase in the wiring length can be also reduced.

In the embodiments described above, two semiconductor chips on which the group of cells and wiring pattern are divisionally formed are bonded face-to-face to each other. However, a plurality of semiconductor chips on which the group of cells and wiring pattern are divided in three or more parts may be bonded face-to-face to each other. Such a manner of dividing the pattern on the single chip into three or more parts may increase the degree of the number of cells with the pins which can be connected to each other.

What is claimed is:

1. A semiconductor integrated circuit device comprising an assembly of a plurality of cells each comprising an integrated circuit and a plurality of wiring patterns which together constitute a prescribed integrated circuit pattern, wherein said pluralities of cells and wiring patterns are structurally divided into a plurality of discrete parts and formed on respective semiconductor chips, and surfaces of the integrated circuits formed on said plurality of semiconductor chips are directly bonded face-to-face to each other to constitute said prescribed integrated circuit pattern and to reduce the length of said wiring patterns.

2. A semiconductor integrated circuit device according to claim 1, wherein said cells are structurally divided into a plurality of sub-groups of cells and formed on said respective semiconductor chips.

3. A semiconductor integrated circuit device according to claim 1, wherein said cells and said wiring patterns are structurally divided into a group of cells and a group of wiring patterns, said groups being formed on the respective semiconductor chips.

4. A semiconductor integrated circuit device according to claim 3, wherein said cells and said wiring patterns are structurally divided into a group of cells and a group of wiring patterns including a power source and a GND, which are formed on the respective semiconductor chips.

5. A semiconductor integrated circuit device according to claim 1, wherein I/O terminals of said cells formed on said chips are connected by said face-to-face bonding of said chips.

6. A semiconductor integrated circuit device according to claim 1, wherein said divided parts are fabricated by different process technologies.

\* \* \* \* \*